(12) United States Patent
Cohen et al.

(10) Patent No.: US 8,169,031 B2
(45) Date of Patent: May 1, 2012

(54) CONTINUOUS METAL SEMICONDUCTOR ALLOY VIA FOR INTERCONNECTS

(75) Inventors: Guy M. Cohen, Mohegan Lake, NY (US); Christos D. Dimitrakopoulos, Baldwin Place, NY (US); Alfred Grill, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 12/198,592

(22) Filed: Aug. 26, 2008

(65) Prior Publication Data

US 2010/0052018 A1 Mar. 4, 2010

(51) Int. Cl.
*H01L 21/70* (2006.01)

(52) U.S. Cl. ....................... 257/369; 438/197

(58) Field of Classification Search .............. 257/396, 257/369; 438/197
See application file for complete search history.

(56) References Cited

U.S. PATENT DOCUMENTS

| | | | |
|---|---|---|---|
| 6,348,390 B1* | 2/2002 | Wu | 438/305 |
| 2004/0097047 A1* | 5/2004 | Natzle et al. | 438/300 |
| 2004/0256662 A1 | 12/2004 | Black et al. | |
| 2005/0151165 A1* | 7/2005 | Chan et al. | 257/198 |
| 2005/0156238 A1* | 7/2005 | Wen et al. | 257/347 |
| 2006/0186451 A1* | 8/2006 | Dusberg et al. | 257/306 |
| 2007/0018205 A1* | 1/2007 | Chidambarrao et al. | 257/288 |

OTHER PUBLICATIONS

Guarini, K. et al., "Low Voltage, scalable nanocrystal FLASH memory fabricated by templated self assembly," IEDM 2003, p. 541 (2003).

Decker, C.A., et al., "Directed growth of nickel silicide nanowires," Applied Physics Letters, vol. 84, No. 8, Feb. 23, 2004, pp. 1389-1391.

* cited by examiner

*Primary Examiner* — Thao Le
*Assistant Examiner* — Geoffrey Ida
(74) *Attorney, Agent, or Firm* — Scully, Scott, Murphy & Presser, P.C.; Vazken Alexanian

(57) ABSTRACT

A contact structure is disclosed in which a continuous metal semiconductor alloy is located within a via contained within a dielectric material. The continuous semiconductor metal alloy is in direct contact with an upper metal line of a first metal level located atop the continuous semiconductor metal alloy and at least a surface of each source and drain diffusion region located beneath the continuous metal semiconductor alloy. The continuous metal semiconductor alloy can be derived from either a semiconductor nanowire or an epitaxial grown semiconductor material. The continuous metal semiconductor alloy includes a lower portion that is contained within an upper surface of each source and drain region, and a vertical pillar portion extending upward from the lower portion. The lower portion of the continuous metal semiconductor alloy and the vertical pillar portion are not separated by a material interface. Instead, the two portions of the continuous metal semiconductor alloy are of unitary construction, i.e., a single piece.

9 Claims, 3 Drawing Sheets

CONTINUOUS METAL SEMICONDUCTOR ALLOY VIA FOR INTERCONNECTS

FIELD OF THE INVENTION

The present invention relates to a semiconductor structure and a method of fabricating the same. More particularly, the present invention relates to a contact structure including a dielectric material having a continuous metal semiconductor alloy located within a via, which structure is used in interconnecting an underlying semiconductor device to external components of a semiconductor chip. The present invention also provides a method of fabricating such a continuous metal semiconductor alloy via-containing contact structure.

BACKGROUND OF THE INVENTION

A semiconductor device such as, for example, a field effect transistor, is often formed with both back end of the line (BEOL) contacts to the gate and source/drain regions of the device to turn the device on/off and to allow current to flow through the device, respectively, and a middle of the line (MOL) contact to the body of the device between the source/drain regions to adjust threshold voltage (Vt).

Traditionally, conductive metals, such as tungsten (W) and aluminum (Al) have been deposited (e.g., by chemical vapor deposition (CVD), sputtering, etc.) into patterned openings (i.e., vias), which are present in the dielectric material of the contact (i.e., metallization) structure, to form both MOL and BEOL contacts. Recently, because of its lower electrical resistivity copper and copper alloys, which require plating, have become the preferred metal for filling the contact openings in both BEOL and MOL contact (i.e., metallization) structures.

Forming contact structures that include vias that are filled with such conductive metals to the source/drain regions and the gate of field effect transistors populated using tight pitch design rules introduce process and material challenges. For example, it was predicted that 20-30 nm vias will show a substantial increase on resistance due to via sidewall roughness and an increase on the filling conductive resistivity. Overcoming the increased conductor resistivity and the need to maintain smooth via sidewalls led to a proposal in which the via conductor will be replaced by bundles of carbon nanotubes (CNTs). While carbon nanotubes were shown to have excellent conduction properties, their integration is challenging. For example, the typical synthesis temperature for carbon nanotubes is above 700° C., which is much higher than the limit of 400° C. imposed by BEOL technology. Additionally, BEOL processes such as photoresist removal by $O_2$ plasma and some PECVD dielectric depositions cannot be carried out in the presence of carbon nanotubes. Furthermore, forming a good contact between the silicide (at the bottom of the via) and the CNTs, and similarly between the metal (at the top of the via) and the CNTs is challenging. Avoiding the contact resistance between two different materials, i.e., the via conductor and the silicide, can further reduce the total access resistance to the device being contacted.

SUMMARY OF THE INVENTION

A contact structure is disclosed in which a continuous metal semiconductor alloy is located within a via contained within a dielectric material. The continuous semiconductor metal alloy is in direct contact with an overlying metal line of a first metal level located atop the continuous semiconductor metal alloy and at least a surface of each source and drain diffusion region located beneath the continuous metal semiconductor alloy. The continuous metal semiconductor alloy can be derived from either a semiconductor nanowire or an epitaxial grown semiconductor material. The term "continuous metal semiconductor alloy" is used throughout the instant application to denote a silicide or germanide that includes a lower portion that is contained within an upper surface of each source and drain region, and a vertical pillar portion extending upward from the lower portion. The lower portion of the continuous metal semiconductor alloy and the vertical pillar portion are not separated by a material interface. Instead, the two portions of the continuous metal semiconductor alloy are of unitary construction, i.e., a single piece.

In one embodiment of the invention, the continuous metal semiconductor alloy is derived from semiconductor nanowires that are formed by a vapor-liquid solid (VLS) technique, which is a catalyst assisted growth method. The temperature used in the VLS technique is typically compatible with BEOL processing. The semiconductor nanowires produced using the VLS technique are very uniform in diameter and smooth on the atomic scale. That is, the semiconductor nanowires maintain the same cross section along a vertical axis. The semiconductor nanowires that are formed are converted to a continuous metal semiconductor alloy by reacting them with a metal semiconductor alloy forming metal.

The electrical characteristics of the thus formed continuous metal semiconductor alloy are similar to the bulk material. As such, the inventive continuous metal semiconductor alloy are superior to a via with a similar dimension that is filled with a conductive metal, such as, for example, tungsten. With metal filled vias an increase in resistance has been observed due to sidewall roughness and due to the metal being comprised of poly-crystalline grains. The nanowires sidewalls are very smooth and in some cases the metal semiconductor alloy (e.g., silicide or germanide) formed with nanowires can be single-crystal (one long grain).

Moreover, because of the anisotropic growth of the semiconductor nanowires, it is possible, in some embodiments, to form the semiconductor nanowires prior to depositing the BEOL dielectric. This further allows for a tighter gate-to-gate pitch than obtainable with conventional vias. Vias are typically tapered with the bottom part being smaller than the top part. To avoid hitting the gate line when etching a via, the gate-to-gate spacing is increased to accommodate the larger via diameter due to tapering. Nanowires fabricated by the VLS technique are very uniform in diameter and therefore allow a tighter pitch.

It is observed that one advantage of using semiconductor nanowires instead of carbon nanotubes is the efficiency of use of available space for each case. In fact, a carbon nanotube is a hollow tube and thus only the skin contributes to the conduction process (or several concentric tubes in the case of multi-walled carbon nanotubes), while in the case of continuous metal semiconductor alloys that are derived from semiconductor nanowires the whole cylinder is contributing to the conduction process.

In another embodiment of the invention, the continuous metal semiconductor alloy is formed by epitaxially growing a semiconductor material from the surface of at least the source region and drain region of a semiconductor structure. The epitaxially grown material is single crystal, and is seamless. The epitaxially grown semiconductor material is converted to a continuous metal semiconductor alloy by reacting it with a metal semiconductor alloy forming metal.

In one embodiment of the invention, a semiconductor structure is provided that includes:

at least one field effect transistor located on a surface of a semiconductor substrate, the at least one field effect transistor including at least a gate electrode, a source region and a drain region;

a continuous metal semiconductor alloy including a lower portion that is contained within an upper surface of each of the source and drain regions, and a vertical pillar portion extending upwardly from the lower portion; and a metal line located on an upper surface of the vertical pillar portion of the continuous metal semiconductor alloy.

In some embodiments of the structure described above, the vertical pillar portion of the continuous metal semiconductor alloy maintains the same cross section along a vertical axis, i.e., the vertical pillar portion is not tapered and is smooth.

In other embodiments of the invention, the continuous metal semiconductor alloy forms a conductive path between the source region and the metal line. In such an embodiment, the conductive path may be ohmic (i.e., there are no electrical junctions due to two dissimilar materials in contact).

In yet another embodiment of the invention, variations of an electrical potential along the conductive path are linear, i.e., there are no electrical junctions due to dissimilar materials.

In a further embodiment of the invention, the vertical pillar portion is comprised of a single-crystal metal semiconductor alloy. In an even further embodiment, the vertical pillar portion is comprised of a metal semiconductor alloy nanowire.

A method of forming the above structure is also provided. In one embodiment of the invention, the above described structure is formed by:

providing at least one field effect transistor on a surface of a semiconductor substrate, the at least one field effect transistor including at least a gate electrode, a source region and a drain region;

forming a semiconductor nanowire from at least a surface of the source region and a surface of the drain region;

converting an upper portion of the source region and the drain region and the semiconductor nanowire into a continuous metal semiconductor alloy, the continuous metal semiconductor alloy includes a lower portion that is contained within an upper surface of each of the source and drain regions, and a vertical pillar portion extending upwardly from the lower portion; and forming a metal line on an upper surface of the vertical pillar portion.

In another embodiment of the invention, the above described structure is formed by:

providing at least one field effect transistor located on a surface of a semiconductor substrate, the at least one field effect transistor including at least a gate electrode, a source region and a drain region;

forming a sacrificial dielectric material having via holes that extend to a surface of at least both the source region and the drain region;

forming an epitaxial semiconductor material within the via holes, the epitaxial semiconductor material is in contact with the surface of both the source region and the drain region;

removing the sacrificial dielectric material;

converting an upper portion of the source region and the drain region and the epitaxial semiconductor material into a continuous metal semiconductor alloy, the continuous metal semiconductor alloy includes a lower portion that is contained within an upper surface of each of the source and drain regions, and a vertical pillar portion extending upwardly from the lower portion; and forming a metal line on an upper surface of the vertical pillar portion.

DETAILED DESCRIPTION OF THE INVENTION

The present invention, which provides a contact structure including a continuous metal semiconductor alloy contact and a method of fabricating the same, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is first made to FIGS. 1A-1F which are pictorial representations (through cross sectional views) illustrating the basic processing steps in accordance with one embodiment of the invention. In the illustrated embodiment, a continuous metal semiconductor alloy is formed by first growing semiconductor nanowires and thereafter converting the semiconductor nanowires into the continuous semiconductor metal alloy by reacting the semiconductor nanowires with a metal semiconductor alloy forming metal.

Figure 1A:
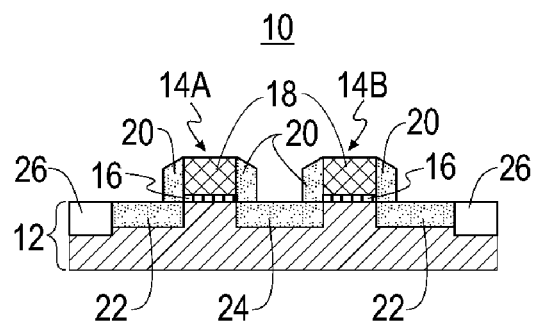
FIGS. 1A-1F are pictorial representations (through cross sectional views) depicting the basic processing steps in accordance with one embodiment of the invention; in the illustrated embodiment semiconductor nanowires are used.

Specifically, FIG. 1A illustrates an initial structure 10 that can be employed in this embodiment of the invention. The initial structure 10 includes a semiconductor substrate 12 having at least one field effect transistor (14A and 14B) located on a surface thereof. The at least one field effect transistor (14A and 14B) includes a gate dielectric 16 located on a surface of the semiconductor substrate 12, a gate electrode 18 located atop the gate dielectric 16, optionally, at least one spacer 20, a source region 22 and a drain region 24. Isolation regions 26 such as shallow trench isolation regions or local oxidation of silicon isolation regions may also be located within the semiconductor substrate 12. In this example substrate 12 is a bulk silicon wafer. It is observed that the invention could also be applied to a silicon-on-insulator (SOI) wafer. When a SOI wafer is used field effect transistor (14A and 14B) are formed in the SOI layer that is electrically isolated from the rest of the substrate by a buried oxide. In every other aspect the structure is effectively the same.

When a plurality of field effect transistors (FETs) are present, some of the FETs may be p-type (i.e., PFETs), and the remaining may be n-type (NFETs). When such FETs of different conductivity type are present, an isolation region typically separates the NFETs from the PFETs. In the drawings, two FETs are shown that share a common diffusion region (i.e., source or drain).

The initial structure 10 shown in FIG. 1A can be formed utilizing conventional techniques that are well known to those skilled in the art. For example, the initial structure 10 can be formed by any sequence of deposition, lithography, and etching. One typical method to form the structure shown in FIG. 1A is to first form the isolation regions within the substrate, then form a stack containing the gate dielectric and gate electrode by deposition, and thereafter use lithography and etching to form a patterned gate region. The optional spacer may then be formed by deposition and etching, followed by ion implantation and annealing, which steps are used to form the source and drain regions. Alternatively, a replacement gate process using a dummy gate can be used. So as not to obscure the invention, the details concerning the processing of the initial structure 10 shown in FIG. 1A is not provided herein.

The semiconductor substrate 12 of the initial semiconductor structure 10 shown in FIG. 1A includes any semiconducting material including, for example, Si, SiGe, SiGeC, SiC, Ge, Ge alloys, GaAs, InAs, InP and other III/V or II/VI compound semiconductors. In addition to these listed types of semiconducting materials, the present invention also contemplates cases in which the semiconductor substrate 12 is a layered semiconductor such as, for example, Si/SiGe, Si/SiC, silicon-on-insulators (SOIs) or silicon germanium-on-insulators (SGOIs). In some embodiments of the present invention, it is preferred that the semiconductor substrate 12 be composed of a Si-containing semiconductor material, i.e., a semiconductor material that includes silicon. In yet other embodiments of the present invention, the semiconductor substrate 12 is composed of a Ge-containing semiconductor. The semiconductor substrate 12 may be doped, undoped or contain doped and undoped regions therein.

It is also noted that the semiconductor substrate 12 may be strained, unstrained or contain strained regions and unstrained regions therein. The semiconductor substrate 12 may also have a single crystal orientation or alternatively, the substrate 12 may be a hybrid semiconductor substrate that has surface regions having different crystallographic orientations. The semiconductor substrate 12 may also have one or more isolation regions such as, for example, trench isolation regions or LOCOS (local oxidation of silicon) isolation regions, located therein.

The semiconductor substrate 12 may have any crystallographic (i.e., crystal) orientation. In a preferred embodiment, the semiconductor substrate 12 is a Si-containing material having a (111), (100) or (110) crystal orientation. In an even more preferred embodiment, the semiconductor substrate 12 is a Si-containing semiconductor material, preferably silicon, having a (111) crystal orientation. The use of silicon having a (111) crystal orientation is preferred in the illustrated embodiment since such a crystal orientation provides a good control over the vertical growth of semiconductor nanowires. In a highly preferred embodiment, the semiconductor substrate 12 may include a thin upper layer of (111) Si located on a surface of a lower layer of (100) Si. Such a substrate as will be described below in reference to FIGS. 3A-3E, can be used to control the nanowire growth orientation while providing FETs with a (100) oriented surface channel.

The gate dielectric 16 is typically comprised of an insulating oxide, nitride, oxynitride, a high-k dielectric such as hafnium oxide, or combinations and multilayers thereof. The thickness of the gate dielectric 16 may vary, but typically, the gate dielectric 16 has a thickness from 0.5 to 10 nm, with a thickness from 0.5 to 3 nm being more typical. The optional at least one spacer 20 is typically comprised of an insulating oxide, nitride, and/or oxynitride as well. The width of the optional at least one spacer 20, as measured at the bottom of the spacer, may vary, with typical ranges being from 20 to 80 nm. The gate electrode 18 is comprised of any conductive material including, for example, polysilicon, SiGe, an elemental metal, an alloy including an elemental metal, a metal silicide, a metal nitride or any combination thereof including multilayers. In one embodiment, the gate electrode 18 is comprised of polySi or SiGe. The thickness of the gate electrode 18 may vary, with typical thicknesses being from 20 to 200 nm.

In some embodiments, a hard mask (typically comprised of an oxide, nitride and/or oxynitride) is present atop the gate electrode. An embodiment, including a hard mask atop the gate electrode is not shown in the present invention. It is noted that when a hard mask is present atop the gate electrode, no nanowire growth atop the hard mask is typically observed. It is also noted that when the gate electrode is not capped by a semiconductor material such as polySi or SiGe, no nanowire growth typically occurs atop the gate electrode.

Figure 1D:
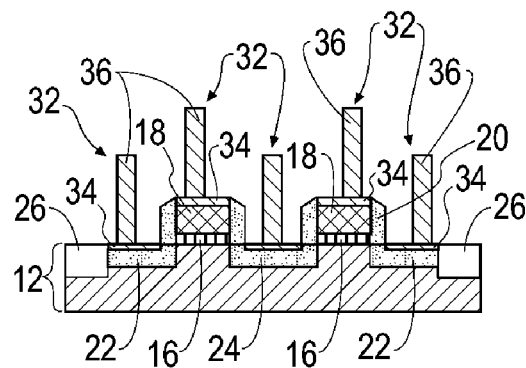
Figure 1B:
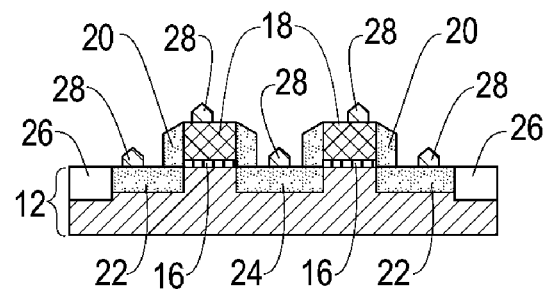

FIG. 1B illustrates the structure of FIG. 1A after forming catalyst particles (i.e., dots) 28 on the surface of the source region 22 and the drain region 24 and the gate electrode 18 of each FET. In some embodiments, and prior to catalyst particle (i.e. dot) 28 formation, a preclean process is performed. The preclean process is used to remove any native oxide and/or other contaminants that will not allow the semiconductor nanowires to mimic the crystal orientation of the underlying semiconductor material.

The preclean step employed in the present invention includes any technique that can remove native oxide and/or other contaminates from the surface of the semiconductor substrate. For example, the preclean step may include, an RCA clean and etching in DHF prior to depositing the catalyst dots 28. It is also possible to desorb the native oxide by annealing the substrate at a temperature of about 700° C. (or higher) in vacuum and then transferring the substrate to a different chamber while maintaining vacuum or a non-oxidizing ambient where the catalyst is deposited in the form of a thin film over the substrate's surface. The thin catalyst film is then patterned into an array of catalyst dots where subsequent growth of nanowires is desired.

The catalyst dots 28 are formed in a grid on the area of the semiconductor substrate (typically atop the source and drain regions and, optionally the gate electrode), where subsequent growth of nanowires is desired. The catalyst dots 28 that can be used in aiding in the formation of the semiconductor nanowires include, but is not limited to Au, Ga, Al, Ti, WC (tungsten carbide) and Ni. Preferably, Al, WC, or Au is used as the catalyst dot material.

The catalyst dots 28 used in growing the semiconductor nanowires can also be formed by other techniques such as evaporation of a metal through pores in a mask. The pores in the mask, which define the size of the catalyst dots, are typically too small to form with current optical lithographic techniques. As a result, self-assembly methods for patterning the masks, such as reported in K. Guarini et al. IEDM 2003, p. 541 (2003) and U.S. Patent Application Publication No. 2004/0256662 A1, publication date Dec. 23, 2004, from a diblock co-polymer can also be used.

Figure 1E:
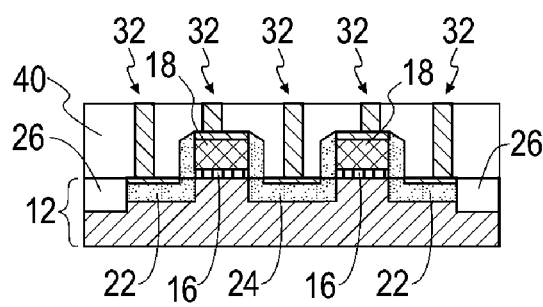
Figure 1C:
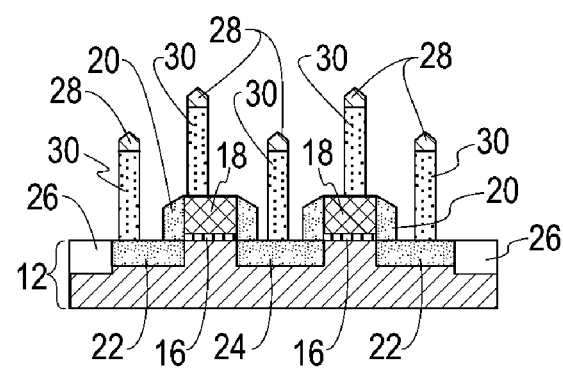

Next, and as shown in FIG. 1C, semiconductor nanowires 30 are grown perpendicular to the substrate surface. The growth of the semiconductor nanowires 30 is assisted by the catalyst dots 28 and is typically carried out by chemical vapor deposition (CVD) or plasma enhanced chemical vapor deposition (PECVD). The growth temperature depends on the semiconductor nanowire precursor used. For example, when silane ($SiH_4$) is used to grow silicon nanowires, the growth temperature is typically from 370° C. to 500° C. The low growth temperature range of 370° C. to 500° C. guarantees that only growth enabled by the catalyst takes place (i.e., enabling nanowires growth but not two dimensional deposition over other surfaces). By adding chlorine to $SiH_4$, the growth temperature can be raised to above 600° C. while maintaining selectivity (i.e., avoiding deposition of silicon on dielectric surfaces). For other precursors such as, for example, silicon tetrachloride ($SiCl_4$), the growth temperature is typically from 800° C. to 950° C. The growth rate of the semiconductor nanowires 30 depends on the growth temperature and the gas pressure in the growth chamber. For example, a typical CVD growth rate of silicon nanowires grown with $SiH_4$ diluted with $H_2$ (1:1) at a pressure of 1 torr and a growth temperature of 450° C. is about 7.6 μm/hour. In one preferred embodiment germane ($GeH_4$) is used to grow germanium nanowires. The nanowire growth with germane has two attractive features: (1) Growth is always selective (no deposition on dielectric surfaces). (2) The growth temperature is about 300° C., which is compatible with the thermal budget imposed by BEOL processing.

The anisotropic growth of the semiconductor nanowires is believed to be best described by the vapor-liquid-solid (VLS) mechanism. See, for example, E. I. Givargizov, "Highly Anisotropic Crystals", Kluwer Academic Publishers, Norwell, Mass., 1986. When the growth is initiated, a metallic-semiconductor (typically a gold-silicon) liquid alloy is formed. With additional supply of semiconductor precursor from the gas phase (e.g., $SiH_4$), the metallic-semiconductor droplet becomes supersaturated with semiconductor material and the excess semiconductor is deposited at the solid-liquid interface. As a result, the liquid droplet rises from the original substrate surface to the tip of a growing nanowire crystal. After semiconductor nanowire 30 growth, the metallic semiconductor liquid alloy will separate during cooling without forming a metal semiconductor solid alloy. As a result, the liquid alloy reverts back to a catalyst dot 28 after cooling.

The orientation of each of the semiconductor nanowires 30 formed atop the source and drain regions matches that of underlying semiconductor substrate since it is seeded from that layer. For example, when the underlying semiconductor substrate has a (111) orientation then the semiconductor nanowire 30 atop at least the source/drain regions has an orientation that is (111) as it is seeded from the semiconductor substrate. The fabrication of the nanowires by VLS growth facilitates the formation of nanocrystals with near identical length, size, and orientation.

The semiconductor nanowires 30 that are formed comprise the same semiconductor material as that found within semiconductor substrate or gate electrode. In a preferred embodiment of the invention, the semiconductor nanowires 30 are comprised of a Si-containing semiconductor material, with silicon nanowires being highly preferred. It is noted that nanowire grown is single crystalline, and no apparent interface exists between the grown semiconductor nanowire and the substrate 12 and/or gate electrode 18. It is further observed that the grown semiconductor nanowires are not tapered and they are smooth.

The semiconductor nanowires 30 that are formed have a length, 1, as measured from the base of the semiconductor substrate 10 and/or gate electrode 18 to the tip, from 25 to 20000 nm, with a length from 100 to 500 nm being even more typical.

Next, and as shown in FIG. 1D, the reformed catalyst dots 28 are removed from the tip of each of the semiconductor nanowires 30 by selective etching. For example, aqua regia (a mixture of nitric acid and hydrochloric acid) will selectively etch the catalyst dots 28 from the tip of each of the semiconductor nanowires 30. The surfaces (top and sidewalls) of the semiconductor nanowires 30, the underlying semiconductor substrate 12 and optionally the gate electrode 18 are cleaned to remove any native oxide therefrom utilizing a stripping process that is well known to those skilled in the art.

FIG. 1D also illustrates the structure after converting the semiconductor nanowires 30 into a continuous metal semiconductor alloy 32. As shown, the continuous semiconductor metal alloy 32 includes a lower portion 34 that is contained within an upper surface of each source and drain region, and a vertical pillar portion 36 extending upwardly from the lower portion 34. The lower portion 34 and the vertical pillar portion 36 of the continuous metal semiconductor alloy 32 are not separated by a material interface. Instead, the two portions (34 and 36) of the continuous metal semiconductor alloy 32 are of unitary construction, i.e., a single piece. Since the continuous metal semiconductor alloy lacks an interface between the various portions, little or no contact resistance is observed.

The converting occurs by a so-called self-aligned silicidation, i.e., salicidation, process that includes first forming a metal semiconductor alloy forming metal (not shown) across the entire structure after the catalyst dots have been removed. The metal semiconductor alloy forming metal includes any metal that is capable of reacting with a semiconductor material to form a silicide or germanide. Examples of such metals include, but are not limited to Ti, Ni, Pt, W, Co and Ir. A conventional alloy additive (such as an anti-agglomeration alloy) can also be present in the metal semiconductor alloy forming metal.

The metal semiconductor alloy forming metal is formed utilizing any conformal deposition process including, for example, chemical vapor deposition (CVD), plasma enhanced chemical vapor deposition (PECVD), and atomic layer deposition (ALD). For example when Ni is used the thickness of the metal semiconductor alloy forming metal may vary, with a range from 3 to 10 nm being typical.

In some embodiments, a diffusion barrier such as TiN or TaN is formed atop the metal semiconductor alloy forming metal utilizing conventional deposition techniques that are well known in the art.

A heating, i.e., anneal, step is then performed to cause reaction between the metal semiconductor alloy forming metal and the underlying semiconductor material. The heating is performed using conditions that are well known to those skilled in the art. In some embodiments, a single anneal is used. In another embodiment, a two step anneal is used. The two step anneal is used in instances where excess metal (such as on a sidewall) could consume too much silicon from the source and drain regions. The excess metal is selectively etched after the first annealing, and a second annealing (usually at an elevated temperature) is applied to form the desired silicide phase (which is usually the lowest resistance phase). For example, when Ni is used rapid thermal annealing (RTA) is used to form the nickel-silicide phase, NiSi. The annealing temperature is about 400-450° C. A second anneal is not needed in this case since NiSi is the lowest resistance phase.

FIG. 1E illustrates the structure of FIG. 1D after forming a dielectric material 40. The dielectric material 40, which includes any middle of the line dielectric material, can be formed utilizing any conventional deposition process including, but not limited to CVD, PECVD, chemical solution deposition, evaporation, and spin-on coating. Illustrative examples of typical middle of the line dielectrics that can be used as dielectric material 40 include $SiO_2$, a doped or undoped silicate glass, a C doped oxide (i.e., an organosilicate) that includes atoms of at least Si, C, H and O, a silsesquioxane, a thermosetting polyarylene ether or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl, and the like.

The dielectric material 40 typically has a dielectric constant that is about 4.0 or less, with a dielectric constant of about 2.8 or less being even more typical. The thickness of the dielectric material 40 may vary so long at it extends to at least an upper surface of the vertical pillar portion 36 of the continuous metal semiconductor alloy 32. In some embodiments, a conventional planarization process such as, for example, chemical mechanical polishing and/or grinding, can follow the deposition of the dielectric material 40. It is noted that the dielectric material 40 fills the spaces between each of the previously formed continuous metal semiconductor alloy via contacts.

Figure 1F:
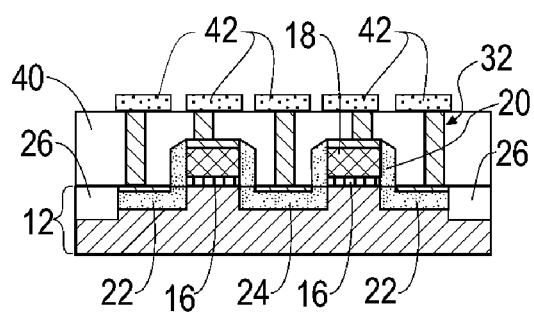

FIG. 1F illustrates the structure of FIG. 1E after forming a metal line 42 of a first metal level. As is shown, each metal line 42 is in contact with the vertical pillar portion 36 of the underlying continuous metal semiconductor alloy 32. The metal lines 42 are formed by deposition, patterning and etching. The deposition may include CVD, PECVD, sputtering and plating. The metal lines 42 may comprise any conductive metal, with W, Cu, Al and alloys of these metals being highly preferred. The thickness of each metal line may vary, with a typically thickness being from 50 to 200 nm.

Reference is now made to FIGS. 2A-2G, which are pictorial representations (through cross sectional views) depicting the basic processing steps in accordance with another embodiment of the invention; in the illustrated embodiment an epitaxial grown semiconductor material is used to form the continuous metal semiconductor alloy contact.

Figure 2A:
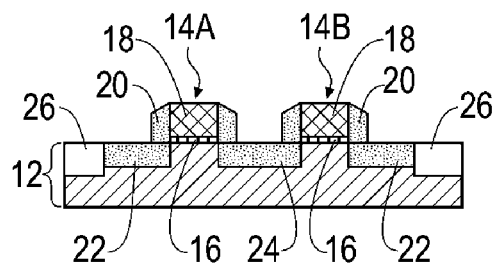
FIGS. 2A-2G are pictorial representations (through cross sectional views) depicting the basic processing steps in accordance with another embodiment of the invention; in the illustrated embodiment an epitaxial grown semiconductor material is used.

This embodiment of the invention begins by first providing the initial structure 10 shown in FIG. 2A. It is noted that FIG. 2A is the same as that shown in FIG. 1A and, as such, no further description concerning the elements and processes used to form the same are provided. It is further noted that like elements in FIG. 2A as in FIG. 1A include the same reference numerals.

Next, a sacrificial dielectric material 49 is formed which has contact openings 50 that extend at least down to the surface of the semiconductor substrate 12 in areas including the source/drain regions. The resultant structure including the sacrificial dielectric material 49 having contact openings 50 formed therein is shown, for example, in FIG. 2B.

Contact openings to the gate electrode 18 can also be formed as shown. The sacrificial dielectric material 49 is comprised of any insulating material including, for example silicon oxide, silicon nitride, and/or silicon oxynitride. Typically, the sacrificial dielectric material 49 is of a different dielectric as compared with the at least one spacer 20. The sacrificial dielectric material 49 is formed utilizing a conventional deposition process such as, for example, CVD and PECVD. The contact openings 50 are formed by providing a patterned resist mask atop the sacrificial dielectric material 49 and etching through the patterned resist mask utilizing a dry etching process (including, for example, reactive ion etching, ion beam etching, plasma etching, or laser ablation) or a chemical wet etching.

Figure 2D:
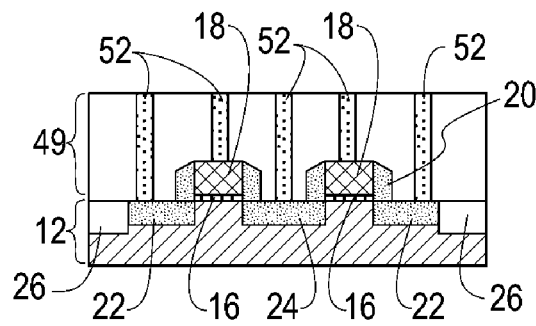
Figure 2B:
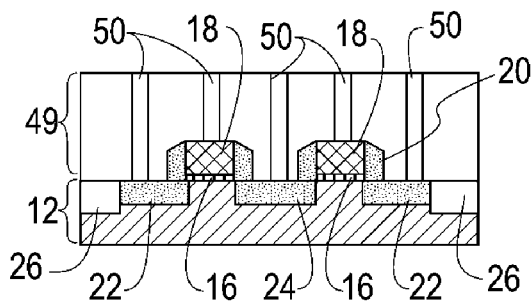
Figure 2E:
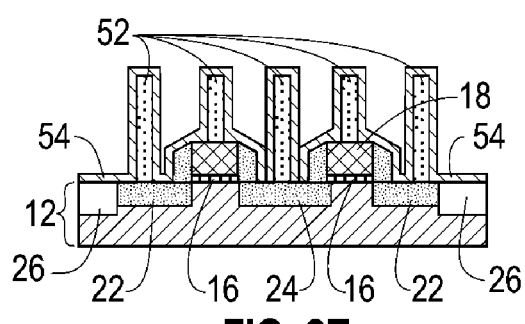
Figure 2C:
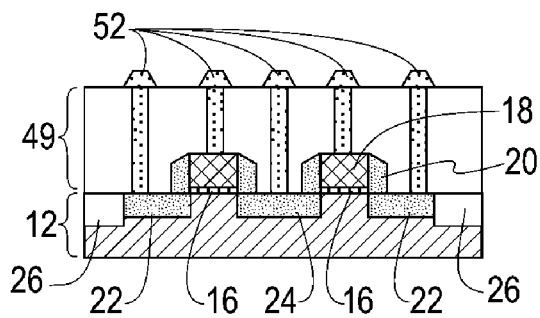
Figure 2F:
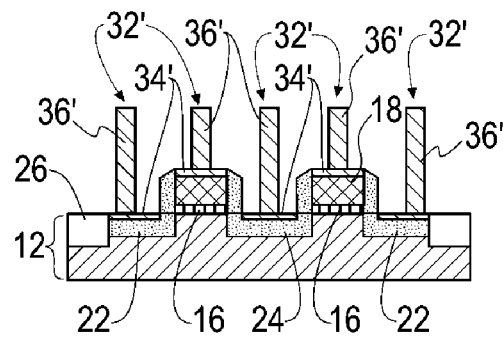

FIG. 2C illustrates the structure of FIG. 2B after epitaxial growth of a semiconductor material 52. The semiconductor material used comprises the same material as that of substrate 12, with Si-containing semiconductors and Ge being highly preferred. The epitaxial growth process is performed utilizing any conventional technique and conditions that are capable of forming an epitaxial semiconductor material. The epitaxial semiconductor material 52 that is formed is single crystalline, and seamless. Also, there is no apparent interface between the epitaxial semiconductor material 52 and the underlying semiconductor material from which it is grown.

Since some portion of the epitaxial semiconductor material 52 extends outside the contact openings 50 onto an upper surface of the dielectric material (See, FIG. 2C), a planarization process (such as chemical mechanical planarization and/or grinding) can be used to form the planar structure shown in FIG. 2D.

Next, the sacrificial dielectric material 49 is removed from the structure shown in FIG. 2D utilizing any conventional etch back process that is selective for removing the sacrificial dielectric material 49. An example of such an etch back process that can be used to selectively remove the sacrificial dielectric material 49 includes diluted HF when material 49 is $SiO_2$, and $O_2$ plasma when material 49 is an organic film (for example polyimide).

Next, and as shown in FIG. 2E, a metal semiconductor alloy forming metal 54 is conformally formed. The metal semiconductor alloy metal 54 that is used in this embodiment of the present invention is the same as that described above for the embodiment including the semiconductor nanowires. The metal semiconductor alloy forming metal 54 is formed utilizing one of the deposition techniques described above in the other embodiment. An optional diffusion barrier (not shown) can also be formed.

After providing the structure shown in FIG. 2E, a heating step, as described above, is used to cause reaction between the forming metal 54 and the epitaxial semiconductor material 52 including the surface of the semiconductor material 22, 24, and 18, to form the continuous metal semiconductor alloy contact, which is labeled as 32'. The resultant structure that is formed after performing the heating step is shown, for example, in FIG. 2F. As shown, the continuous semiconductor metal alloy 32' includes a lower portion 34' that is contained within an upper surface of each source and drain region, and a vertical pillar portion 36' extending upwardly from the lower portion 34'. The lower portion 34' and the vertical pillar portion 36' of the continuous metal semiconductor alloy 32' are not separated by a material interface. Instead, the two portions (34' and 36') of the continuous metal semiconductor alloy 32' are of unitary construction, i.e., a single piece. Since the continuous metal semiconductor alloy lacks an interface between the various portions, little or no contact resistance is observed.

Figure 2G:
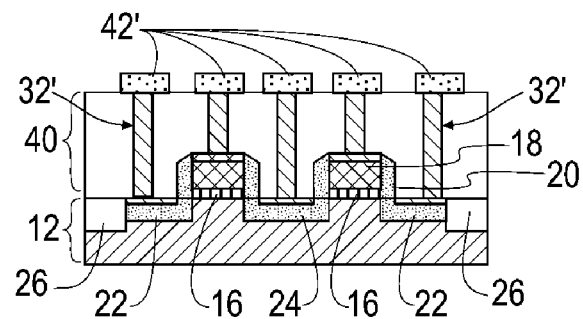

FIG. 2G illustrates the structure after dielectric material 40 formation and after forming the metal line 42. The dielectric material 40 and the metal line 42 are formed as described in the embodiment including the semiconductor nanowires.

It should be pointed out that the vertical pillar portion formed in the embodiment shown in FIGS. 1A-F is derived from a semiconductor nanowire, while the vertical pillar portion in the embodiment shown in FIGS. 2A-2G is derived from an epitaxially grown semiconductor material. The lower portion of the metal semiconductor alloy in which embodiment is derived from the material within the source/drain regions and, optionally, the gate electrode. It is further observed that the vertical pillar portion and the lower portion (collectively referred to herein as a metal semiconductor alloy) form a contact that has lower contact resistance as compared to prior art contacts that includes a separate silicide/germanide region and a conductively filled metal via.

Figure 3A:
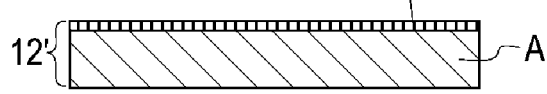
FIGS. 3A-3E are pictorial representations (through cross sectional views) depicting the basic processing steps that can be used in the embodiment depicted in FIGS. 1A-1F for controlling the nanowire growth orientation.
Figure 3B:
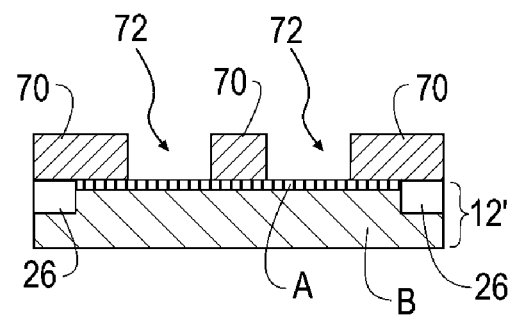
Figure 3C:
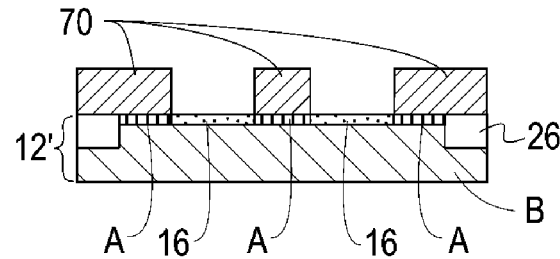
Figure 3D:
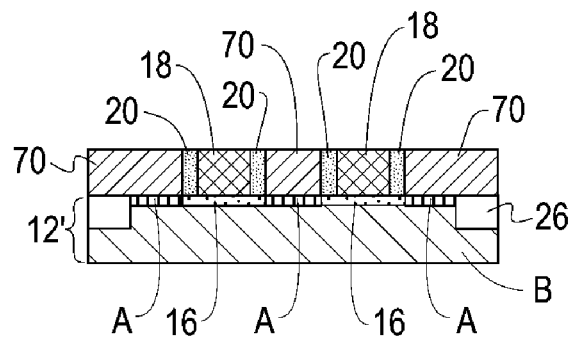
Figure 3E:
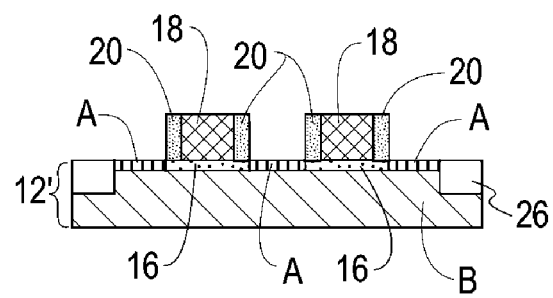

Reference is now made to FIGS. 3A-3E, which are pictorial representations (through cross sectional views) depicting the basic processing steps that can be used in the embodiment depicted in FIGS. 1A-1F for controlling the nanowire growth orientation. In the illustrated processing steps, a semiconductor substrate 12' is formed that includes a lower layer A comprised of (100) Si and an upper layer B comprised of (111) Si. The semiconductor substrate 12' is formed utilizing a conventional bonding process that is well known to those skilled in the art. Next, and as shown in FIG. 3B, isolation regions 26 are formed and a patterned hardmask 70 having openings 72 is formed to expose surfaces of the substrate 12' (i.e., the upper layer B comprised of (111) Si) in which the FETs will be formed. The patterned hard mask 70 having the openings 72 is formed by first depositing a blanket layer of hardmask material (i.e., an oxide, nitride, and/or oxynitride), forming a patterned resist atop the hard mask material, and etching through the patterned resist utilizing a conventional etching process. FIG. 3C shows the structure after subjecting the exposed areas of the upper layer B comprised of (111) Si to one of oxidation, nitridation and oxynitridation. This step forms the gate dielectric 16 of each FET, or alternatively dielectric film 16 may be removed and a new gate dielectric may be deposited. It is observed that the oxidation forming film 16 is meant to consume all of the silicon (111), i.e., film B, so the FET channel forms in silicon (100). Spacer 20 is then formed, followed by filling the remaining opening with the gate electrode 18 so as to provide the structure shown in FIG. 3D. Next, the patterned hardmask 70 is removed utilizing a conventional hardmask material stripping process so as to provide the structure shown in FIG. 3E. This structure can be used as the initial structure 10 shown in the embodiment depicted in FIGS. 1A-1F.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    at least one field effect transistor located on a surface of a semiconductor substrate, said at least one field effect transistor including at least a gate electrode, a source region and a drain region;
    a continuous metal semiconductor alloy comprising a metal semiconductor alloy nanowire and including a lower portion that is contained within an upper surface of each of said source and drain regions, and a vertical pillar portion extending upwardly from said lower portion, wherein said lower portion and said vertical pillar portion are of unitary construction containing no material interface therebetween, and wherein said vertical pillar portion of the continuous metal semiconductor alloy does not contact an outer surface of a spacer located on at least a vertical sidewall of said gate electrode and has a lesser width than the lower portion;
    a dielectric material having an upper surface that extends above an upper most surface of the at least one field effect transistor and is located on said surface of said semiconductor substrate, wherein said dielectric material embeds said vertical pillar portion of said continuous metal semiconductor alloy and wherein a top portion of said vertical pillar portion of said continuous metal semiconductor alloy directly contacts said upper surface of said dielectric material and is exposed; and
    a metal line located on said top portion of said vertical pillar portion of the continuous metal semiconductor alloy and on said upper surface of said dielectric material.

2. The semiconductor structure of claim 1 wherein said metal semiconductor alloy nanowire is a metal silicide nanowire.

3. The semiconductor structure of claim 1 wherein said metal semiconductor alloy nanowire is a metal germanide nanowire.

4. The semiconductor structure of claim 1 wherein vertical pillar portion of the continuous metal semiconductor alloy maintains the same cross section along a vertical axis.

5. The semiconductor structure of claim 1 wherein the continuous metal semiconductor alloy forms a conductive path between the source region and the metal line.

6. The semiconductor structure of claim 5 wherein said conductive path is ohmic.

7. The semiconductor structure of claim 5 wherein said conductive path exhibits variations in electrical potential that are linear.

8. The semiconductor structure of claim 1 wherein said semiconductor substrate comprises Si having a (100) crystal orientation.

9. The semiconductor structure of claim 1 further comprising a continuous metal semiconductor alloy located atop said gate electrode.

* * * * *